United States Patent
Wang et al.

(10) Patent No.: US 9,024,427 B2
(45) Date of Patent: May 5, 2015

(54) MULTIPLE HELIX SUBSTRATE AND THREE-DIMENSIONAL PACKAGE WITH SAME

(71) Applicants: Huan Wang, Tianjin (CH); Aipeng Shu, Tianjin (CH); Shu An Yao, Tianjin (CH)

(72) Inventors: Huan Wang, Tianjin (CH); Aipeng Shu, Tianjin (CH); Shu An Yao, Tianjin (CH)

(73) Assignee: Freescale Semiconductor. Inc, Austin, TX (US)

( * ) Notice: Subject to any disclaimer, the term of this patent is extended or adjusted under 35 U.S.C. 154(b) by 0 days.

(21) Appl. No.: 14/178,244

(22) Filed: Feb. 11, 2014

(65) Prior Publication Data

US 2014/0284805 A1 Sep. 25, 2014

Related U.S. Application Data

(63) Continuation-in-part of application No. 13/848,734, filed on Mar. 22, 2013, now Pat. No. 8,907,464.

(30) Foreign Application Priority Data

Mar. 29, 2013 (CN) .......................... 2013 1 0229576

(51) Int. Cl.
| | |
|---|---|
| H01L 23/02 | (2006.01) |
| H01L 23/04 | (2006.01) |
| H01L 23/34 | (2006.01) |
| H01L 23/48 | (2006.01) |
| H01L 25/065 | (2006.01) |
| H01L 23/00 | (2006.01) |
| H05K 1/14 | (2006.01) |
| H05K 1/18 | (2006.01) |
| H05K 3/28 | (2006.01) |

(52) U.S. Cl.
CPC ............ *H01L 25/0652* (2013.01); *H01L 24/80* (2013.01); *H05K 1/141* (2013.01); *H05K 1/144* (2013.01); *H05K 1/181* (2013.01); *H05K 3/284* (2013.01); *H05K 2201/041* (2013.01); *H05K 2201/09027* (2013.01)

(58) Field of Classification Search
CPC ................... H01L 2924/00; H01L 2924/1815; H01L 2224/32145; H01L 2224/45015; H01L 2224/15145; H01L 2224/48145; H01L 2224/48137; H01L 25/0657; H01L 27/0207; H01L 27/11565; H01L 27/11519; H01L 2225/06562; H01L 2225/06568; H01L 23/13; H01L 23/3121; H01L 23/50; H01L 23/528; H01L 23/5385; H01L 23/31; H01L 29/0657; H01L 24/80; H01L 24/90
USPC .................. 257/686, E21.499, E21.614, 773, 257/E25.029, 723, E25.013, 690, 692, 676, 257/678, 734, E25.027, 668, E23.004, 257/E23.145, E23.151, 691, 698, E23.124, 257/E25.006, E27.026, E23.172, 685, 257/E23.003, E23.178, E23.07, E23.085, 257/E23.123, E25.016, E25.021, E31.117, 257/787, E33.056, E33.059, E51.002, 100, 257/684, 687, 689; 438/455, 107, 127, 106, 438/124, 128, 596, 26, 51, 55
See application file for complete search history.

(56) References Cited

U.S. PATENT DOCUMENTS 6,256,203 B1 * 7/2001 Ingraham et al. ............. 361/720
8,907,464 B2 12/2014 Wang et al.

*Primary Examiner* — Julio J Maldonado
*Assistant Examiner* — Cory Eskridge
(74) *Attorney, Agent, or Firm* — Charles Bergere

(57) ABSTRACT

A three dimensional package includes a substrate having a columnar part including a sidewall, and stairs or steps arranged along the sidewall of the columnar part in the form of multiple helixes twisted around the columnar part. Semiconductor integrated circuits (IC dies) are attached on one or both of the supporting surfaces of the stairs. The columnar part, the stairs and the IC dies can be encapsulated with a mold compound.

9 Claims, 4 Drawing Sheets

MULTIPLE HELIX SUBSTRATE AND THREE-DIMENSIONAL PACKAGE WITH SAME

The present application is a continuation-in-part of U.S. patent application Ser. No. 13/848,734 filed Mar. 22, 2013, assigned to Freescale Semiconductor, Inc.

FIELD OF THE INVENTION

Background of the Invention

The present invention relates to semiconductor packaging and, more particularly, to a substrate having multiple helixes and a three-dimensional (3D) package having the same.

Recently, with the advances in integrated circuit (IC) technology, 3D packages have been developed. 3D packaging involves either stacking two or more integrated circuit (IC) dies within a single package, or stacking and connecting completed packages. 3D packages offer significant size reductions compared to existing packages as they pack more circuitry per square centimeter of board space and per cubic centimeter of application space. In light of these and numerous other advantages, 3D packages are capturing an increasing share of the market for IC packages. However, conventional 3D packages use stacked IC dies or comprise stacking and connecting completed packages to combine more functions in one package. Thus, the number of Input/Output (I/O) contacts for electrical connection between IC dies in the package and an external device, as well as the number of stacked dies is limited. Therefore, it would be desirable to be able to assemble a 3D package with more I/O contacts and more layers of stacked-IC dies.

Accordingly, it is an object of the present invention to provide a 3D package having more I/O contacts and more stacked dies and a method of assembling such a package to solve the above-mentioned shortcomings of existing 3D packages.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

One embodiment of the present invention provides a substrate for a three-dimensional (3D) package. The substrate comprises a columnar part and a plurality of stairs. The columnar part includes two end surfaces and a sidewall. The plurality of stairs is arranged along the sidewall of the columnar part in the form of multiple helixes twisted around the columnar part.

Another embodiment of the present invention provides a three-dimensional package. The 3D package comprises a substrate having a columnar part and packaging material such as a mold compound encapsulating the substrate. The columnar part includes two end surfaces and a sidewall. The plurality of stairs is arranged along the sidewall of the columnar part in the form of multiple helixes twisted around the columnar part. At least one of the stairs includes a supporting surface. At least one IC die is bonded on the supporting surface of the stair.

Still another embodiment of the present invention provides a method of manufacturing a three-dimensional package. The method comprises the steps of: forming a substrate by a deposition process, wherein the substrate comprises a columnar part including a sidewall and a plurality of stairs arranged along the sidewall in the form of multiple helixes twisted around the columnar part; attaching at least one IC die to at least one of the plurality of stairs; and encapsulating the substrate and IC die(s) with packaging material.

According to the invention, the number of IC dies in the unit space of the package is increased so that the 3D package according of the present invention, compared to existing 3D packages, allows for more functions per square centimeter of board space and per cubic centimeter of application space. Furthermore, the number of I/O contacts is also significantly increased.

Figure 1:
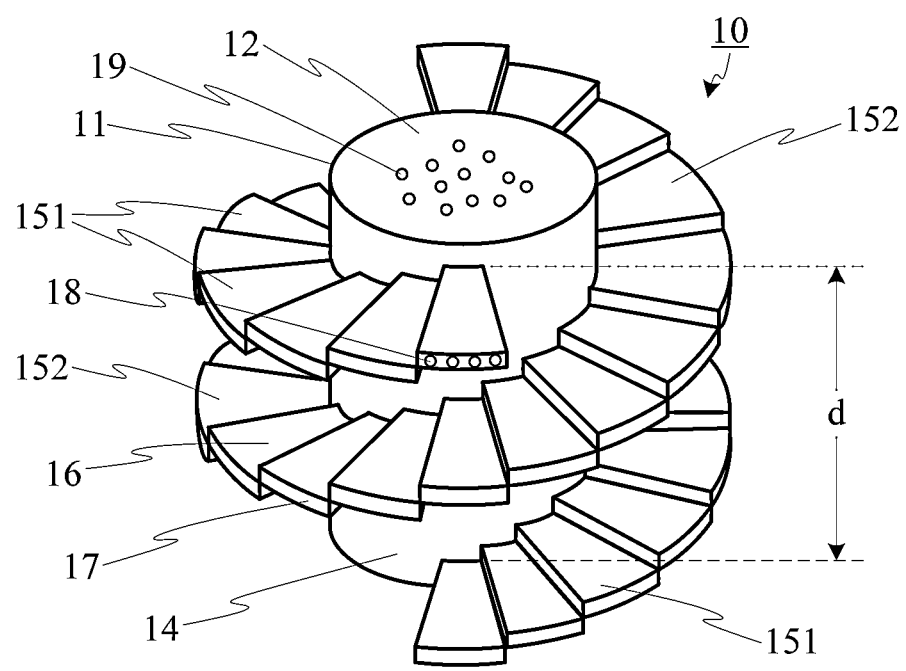
FIG. 1 is a perspective view of a substrate for a 3D package in accordance with an embodiment of the present invention.

Referring now to FIG. 1, a schematic diagram of a substrate 10 for a 3D package in accordance with an embodiment of the present invention is shown. The substrate 10 comprises a columnar part 11, which includes a sidewall 14, a first end surface 12 and a second end surface, which is opposite to the first end surface 12 and not visible in FIG. 1.

The substrate 10 further comprises a plurality of steps/stairs 151 and 152 arranged along the side wall 14 of the columnar part 11. The steps/stairs 151 are arranged in the form of a helix twisted around the columnar part 11, and the stairs 152 are arranged into another helix. From an aesthetic point of view, the substrate 10 looks like a tower with two groups of winding stairs on the outside wall. Only a few of the stairs 151 and 152 are shown in FIG. 1. Persons skilled in the art will understand that the number of the stairs 151 and 152 may vary depending on design requirements, such as the number of IC dies/chips in the package. Each of the stairs 151 and 152 extends radially outward with respect to the columnar part 11. In the illustrated embodiment, each stair 151 abuts an adjacent stair 151, each stair 152 abuts an adjacent stair 152, while the two helixes are intertwined and separated from each other. Each of the stairs 151 and 152 includes a first supporting surface 16 and a second supporting surface (which is opposite to the first supporting surface 16 and not visible in FIG. 1) for supporting a semiconductor IC die, and a side surface 17 departing from the columnar part 11. Preferably, the two helixes have a uniform thread pitch, which is defined as the distance between overlapping stairs of a same helix. As illustrated, the thread pitch herein is "d".

In one embodiment, the side surface 17 of a stair 151 or 152 includes at least one first I/O contact 18 for electrical connection between an external device (not shown) and an IC die attached to one of the first and second supporting surfaces of the stair. Thus, in one embodiment, a stair 151 or 152 comprises a wedge-shaped substrate having wirings and pads that allow a semiconductor IC die attached to a supporting surface 16 of the stair to be connected to the pads using known methods such as wire bonding or flip-chip bumps, with the external connection pads being on a side surface 17.

In some embodiments, the substrate 10 includes at least one second I/O contact 19 on the first end surface 12 and/or the second end surface of the columnar part 11, for electrical connection between the IC dies and an external device. In such a case, the stairs 151 and 152 have contacts on one or both of the supporting surfaces so that wires (routes) can interconnect the second I/O contacts 19 and the IC dies.

The substrate 10 may be made up of a material chosen from the group of organic, ceramic, glass, silicon, and Gallium arsenide. The columnar part 11 and the stairs 151 and 152 are generally made of the same material, and integrated together into one piece. For example, the substrate 10 may be formed layer by layer with the internal circuits embedded at the same time, with the help of a 3D printer or a 3D molding machine. An exemplary substrate comprises 10-30 stairs 151 and 10-30 stairs 152 circling around the columnar part 11 in 1-3 circles, respectively, each stair 151 or 152 having a radian within the range from $2\pi/20$ to $2\pi/6$. A substrate comprising the stairs of other quantities and circles is also probable. Each stair 151 or 152 may have a laminate structure with several layers, as desired.

In some other embodiments, the substrate comprises stairs arranged along the sidewall of the column part in the form of three, four or even more helixes twisted around the columnar part.

Figure 2:
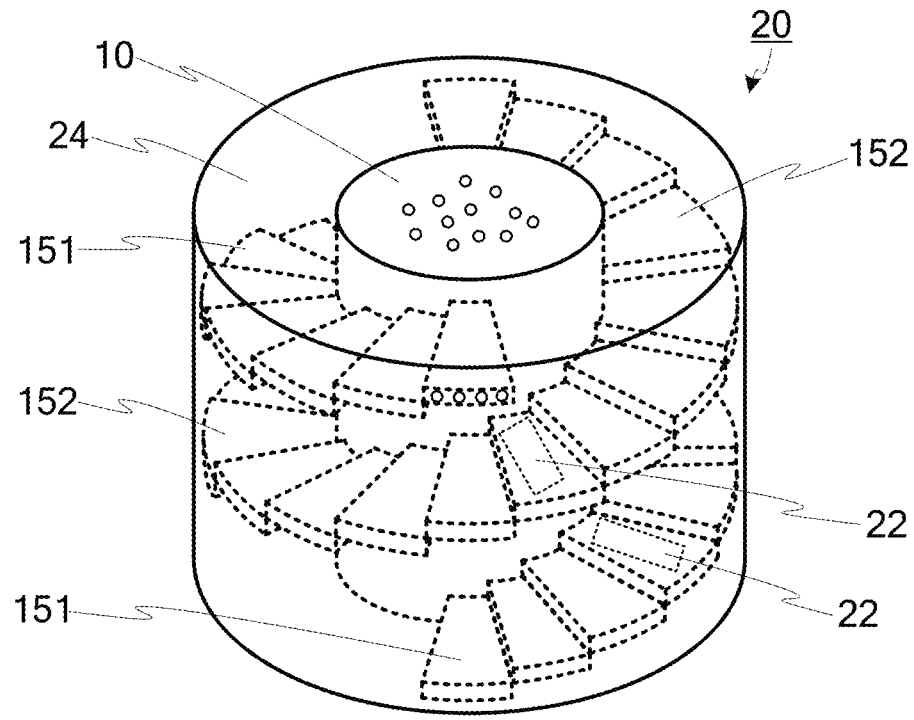
FIG. 2 is a perspective view of a 3D package in accordance with an embodiment of the present invention.

Referring to FIG. 2, a perspective view of a 3D package 20 in accordance with an embodiment of the present invention is shown. The 3D package 20 comprises, in addition to the substrate 10 described with reference to FIG. 1, at least one IC die 22 that is attached or bonded on a stair 151 or 152 of the substrate 10, and packaging material 24 that encapsulates the substrate 10 and the at least one IC die 22. The packaging material 24 comprises a plastic material or mold compound, as are known in the art. The at least one IC die 22 may comprise various types of devices, such as a microcontroller unit (MCU), a System on a Chip (SoC), an application specific IC (ASIC), etc. The packaging material 24 may comprise well known commercially available materials such as plastic or epoxy. In this example, the 3D package 20 has a cylindrical shape. In other embodiments, the 3D package 20 could also be formed as other shapes, such as a cube.

Figure 3:
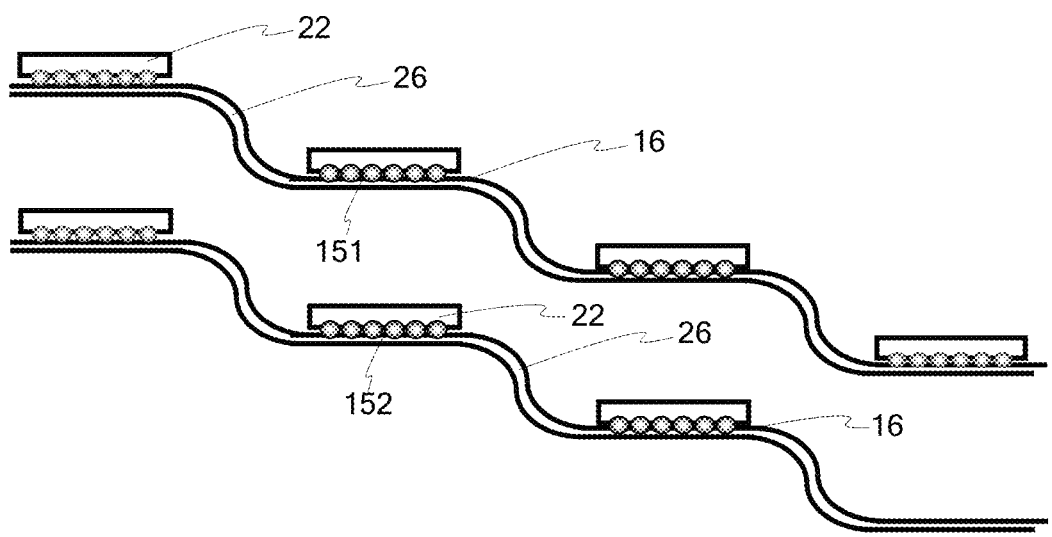
FIG. 3 is a stretched out cross-sectional view of steps/stairs of the 3D package in accordance with the embodiment shown in FIG. 2.

FIG. 3 is a stretched-out view of stairs of the 3D package in accordance with the embodiment shown in FIG. 2 and illustrates how the IC dies 22 may be attached to the first supporting surfaces 16 of the stairs 151 or 152. For example, the IC dies 22 may be bonded on the first supporting surfaces 16 of the stairs 151 by Gold Bump Soldering, Flip-chip attaching, Stud Bump Bonding, or any other suitable means. In this embodiment, at the connection between one stair and its adjacent stair, each stair 151 or 152 has a rounded corner 26. That is, the connection between stairs 151 or 152 has a smooth surface so that the packaging material 24 can flow easily along the stairs 151 or 152 when the substrate 10 and IC dies are being encapsulated with the packaging material 24.

As previously discussed, the distance between overlapping stairs of a same helix of the substrate 10 is termed thread pitch "d". When the thread pitch "d" is significantly greater than a thickness of the IC die 22, known IC die bonding methods may be used, such as Flip Chip attaching. When the thread pitch "d" is close to the thickness of the IC die, known IC die bonding methods may be less convenient. An alternative method of attaching an IC die 22 to a stair 151 or 152 is described below for such situation.

Figure 4:
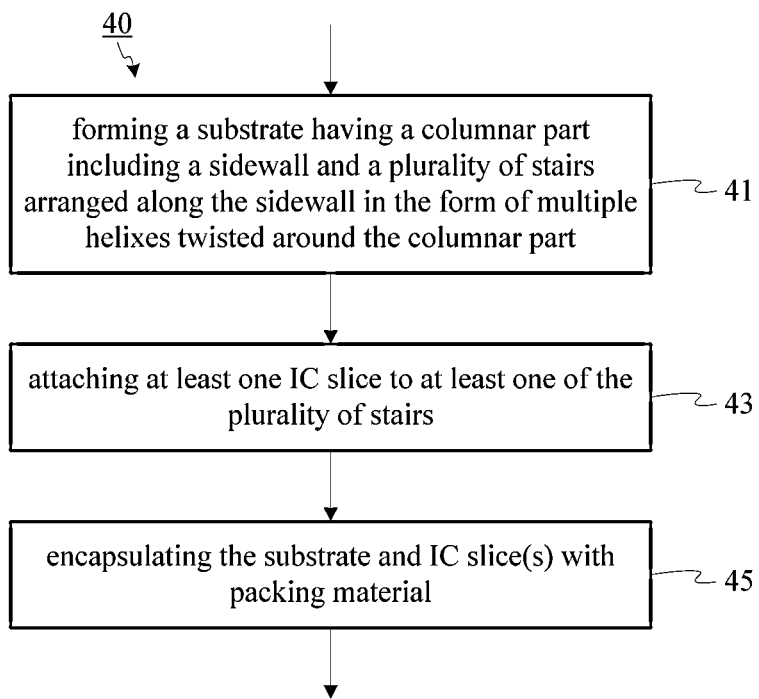
FIG. 4 is a flow chart illustrating a method of assembling a 3D package in accordance with an embodiment of the present invention.
Figure 5:
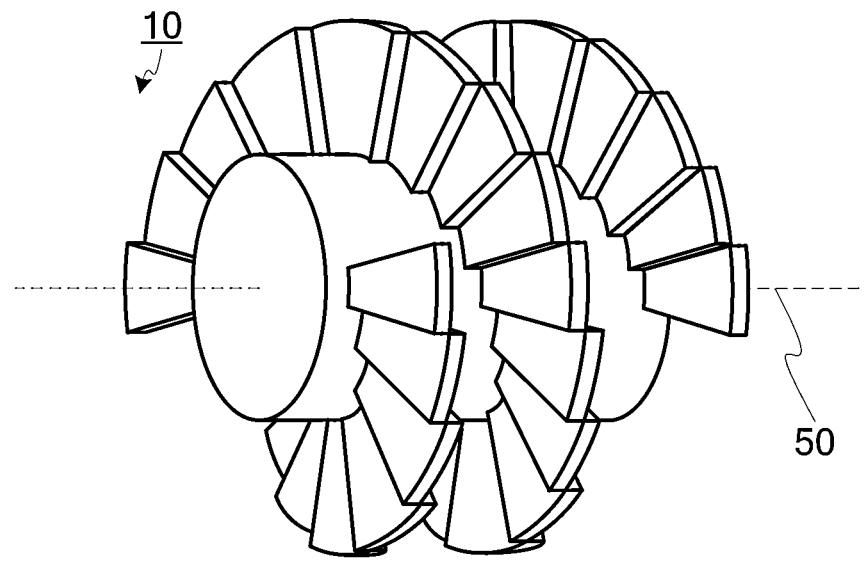
FIG. 5 is a perspective view of a substrate with its axis extending horizontally.
Figure 6A:
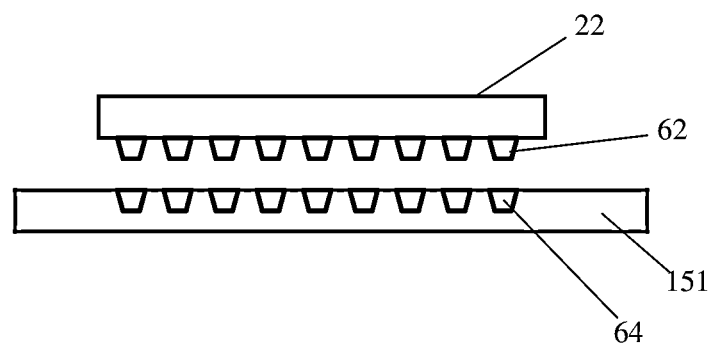
FIG. 6A is a cross-sectional side view illustrating the IC dies and the stairs in accordance with an embodiment of the present invention.
Figure 6B:
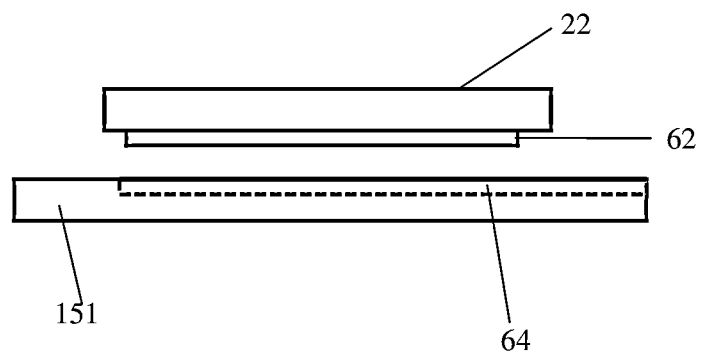
FIG. 6B is a cross-sectional side view illustrating the IC dies and the stairs in accordance with another embodiment of the present invention.
Figure 6C:
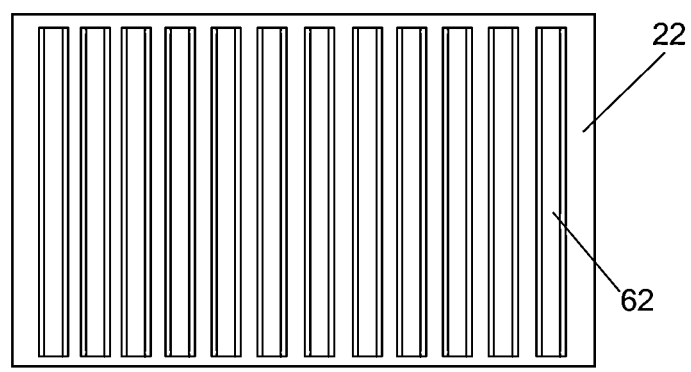
FIG. 6C is a bottom plan view illustrating the IC dies in accordance with an embodiment of the present invention.

FIG. 4 is a flow chart illustrating a method of forming a 3D package in accordance with an embodiment of the present invention. FIG. 5 is a schematic diagram of a substrate with its axis extending horizontally. FIG. 6A is a front view illustrating an IC die 22 being attached to a stair 151 or 152 in accordance with an embodiment of the present invention; FIG. 6B is a side view illustrating the IC die 22 and the stair 151 or 152 in accordance with an embodiment of the present invention; and FIG. 6C is a bottom view illustrating one of a plurality of the IC dies 22 in accordance with an embodiment of the present invention.

Referring now to FIG. 4, the method 40 comprises the steps 41, 43 and 45.

In the step 41, the substrate 10 is formed. The substrate 10 comprises a columnar part including a sidewall, and a plurality of stairs arranged along the sidewall in the form of multiple helixes twisted around the columnar part. For example, the substrate 10 could be formed layer by layer with the internal circuits embedded at the same time, with the help of a 3D printer or a 3D molding machine.

In the step 43, at least one IC die is attached to at least one of the plurality of stairs. First, the substrate 10 is configured such that a central axis 50 of the substrate 10 extends horizontally, which is generally the forwarding direction of an assembly line, as shown in FIG. 5. Second, an IC die is moved, vertically to the central axis, by a flip chip bonder (not shown) onto a first or second supporting surface of one of the stairs 151 or 152 of the substrate 10. Third, the IC die is bonded on the first or second supporting surface of the one stair 151 or 152 of the substrate 10.

As shown in FIGS. 6A-6C, the IC die 22 includes a plurality of electrode pins 62 on one surface thereof, and the stair 151 or 152 includes a plurality of grooves 64, which are configured to receive the plurality of electrode pins 62 of the IC die 22, on one supporting surface thereof. The electrode pins 62 of the IC die 22 are inserted by the bonder into the corresponding grooves 64 such that the IC die 22 is bonded on the supporting surface of the stair 151 or 152.

In one embodiment, each pin 62 is shaped as a column with a trapezoid cross section, and each groove 64 has an occlusal cross section relative to the pin 62, such that an IC die 22 may be bound to a stair 151 or 152 by either sliding the grooves 64 with the IC die 22 or sliding the pins 62 of the IC die 22 into the grooves 64 from aside.

In the step 45, the substrate and IC die(s) are encapsulated with a packaging material. As is known, injection procedure may play a part in the step 45.

Although the embodiments described above are directed to chip packaging, persons skilled in the art will understand that the structure of the substrate also can be applied to other fields such as circuit boards, electrical equipment.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A three-dimensional package, comprising:
a substrate comprising:
a columnar part including a sidewall; and
a plurality of stairs arranged along the sidewall in the form of multiple helixes twisted around the columnar part;
wherein at least one of the stairs includes a supporting surface, the substrate further comprising at least one IC die attached to the supporting surface of the at least one stair;
and packaging material encapsulating the substrate including the IC die.

2. The three-dimensional package of claim 1, further comprising at least one first I/O contact on at least one of two end surfaces of the columnar part, wherein the at least one IC die is electrically connected to the at least one first I/O contact.

3. The three-dimensional package of claim 2, further comprising a conductive path inside the columnar part for electrical connection between the at least one IC die and the at least one first I/O contact.

4. The three-dimensional package of claim 2, wherein at least one of the stairs includes a side surface away from the columnar part.

5. The three-dimensional package of claim 4, further comprising at least one second I/O contact on the side surface, wherein the at least one IC die is electrically connected to the at least one second I/O contact.

6. The three-dimensional package of claim 5, further comprising a conductive path inside the at least one of the stairs for electrically connecting the at least one IC die and the at least one second I/O contact.

7. The three-dimensional package of claim 1, wherein the plurality of stairs are arranged in the form of two helixes.

8. A method of manufacturing a three-dimensional package, comprising the steps of:
forming a substrate, wherein the substrate comprises:
a columnar part including a sidewall; and
a plurality of stairs arranged along the sidewall in the form of multiple helixes twisted around the columnar part;
attaching at least one IC die to at least one of the plurality of stairs; and
encapsulating the substrate and IC die(s) with a packaging material.

9. The method of claim 8, wherein the attaching step comprises:
configuring the substrate such that a central axis of the substrate extends horizontally;
moving, vertically to the central axis, an IC die onto a first or second supporting surface of one of the plurality of stairs;
bonding the IC die on the first or second supporting surface of the one stair.

* * * * *